(12) United States Patent
Malone et al.

(10) Patent No.: US 7,758,222 B2
(45) Date of Patent: Jul. 20, 2010

(54) METHOD FOR VACUUM DEPOSITION OF CIRCUITRY ONTO A THERMOPLASTIC MATERIAL AND A VEHICULAR LAMP HOUSING INCORPORATING THE SAME

(75) Inventors: Brian J. Malone, Wyoming, MI (US); Todd M. Nykerk, Holland, MI (US); Timothy J. Kelly, Grand Rapids, MI (US)

(73) Assignee: Ventra Greenwich Holdings Corp., Warren, MI (US)

( * ) Notice: Subject to any disclaimer, the term of this patent is extended or adjusted under 35 U.S.C. 154(b) by 1515 days.

(21) Appl. No.: 10/054,173

(22) Filed: Jan. 18, 2002

(65) Prior Publication Data
US 2002/0117964 A1    Aug. 29, 2002

Related U.S. Application Data

(60) Provisional application No. 60/262,502, filed on Jan. 18, 2001.

(51) Int. Cl.
*F21V 15/01*    (2006.01)
*B60Q 1/00*    (2006.01)

(52) U.S. Cl. .................. 362/546; 362/548; 362/646; 362/265

(58) Field of Classification Search ............... 362/546, 362/545, 548, 646, 265; 427/117, 120, 123, 427/96.1, 96.8; 439/36, 42; 445/58; 29/846, 29/850
See application file for complete search history.

(56) References Cited

U.S. PATENT DOCUMENTS

| | | | |
|---|---|---|---|
| 3,511,982 A * | 5/1970 | Salter | |
| 4,047,018 A * | 9/1977 | Harris | 240/7.1 R |
| 4,091,138 A | 5/1978 | Takagi et al. | |
| 4,246,632 A * | 1/1981 | Hancox | 362/382 |
| 4,504,891 A * | 3/1985 | Mazis | 362/219 |
| 4,532,152 A * | 7/1985 | Elarde | 216/13 |
| 4,774,637 A * | 9/1988 | Budde et al. | 362/61 |
| 4,922,395 A * | 5/1990 | Roney | 362/390 |
| 5,038,255 A | 8/1991 | Nishihashi et al. | |
| 5,529,535 A * | 6/1996 | Forish | 439/56 |
| 5,673,995 A * | 10/1997 | Segaud | 362/83.3 |
| 5,785,534 A * | 7/1998 | Longueville et al. | 439/65 |
| 5,977,489 A * | 11/1999 | Crotzer et al. | 174/257 |
| 6,083,012 A * | 7/2000 | Suzuki et al. | 439/57 |
| 6,100,178 A | 8/2000 | Todd et al. | |
| 6,290,380 B1 * | 9/2001 | Suzuki et al. | 362/543 |
| 6,506,979 B1 * | 1/2003 | Shenut et al. | 174/255 |

FOREIGN PATENT DOCUMENTS

| | | | | |
|---|---|---|---|---|
| JP | 03006361 A | * | 1/1991 | |
| JP | 03185787 A | * | 8/1991 | |
| JP | 08148809 A | * | 6/1996 | |
| JP | 09296156 A | * | 11/1997 | |
| WO | WO 99/60315 | | 11/1999 | |

* cited by examiner

*Primary Examiner*—Jacob Y Choi
(74) *Attorney, Agent, or Firm*—Pepper Hamilton LLP

(57) ABSTRACT

The invention relates to a method for vacuum deposition of circuitry onto a thermoplastic material. In one of its aspects, the invention relates to a vacuum deposition of circuitry for automotive applications. In another of its aspects, the invention relates to a vehicular lamp housing incorporating a circuit placed thereon by vacuum deposition. In another of its aspects, the invention relates to a vehicular lamp housing with vacuum deposition of circuitry powering light-emitting diodes. In another of its aspects, the invention relates to a vehicular lamp housing with a vacuum deposition of circuitry powering removable incandescent lamps.

30 Claims, 11 Drawing Sheets

METHOD FOR VACUUM DEPOSITION OF CIRCUITRY ONTO A THERMOPLASTIC MATERIAL AND A VEHICULAR LAMP HOUSING INCORPORATING THE SAME

BACKGROUND OF THE INVENTION

1. Field of the Invention

The invention relates to a method for vacuum deposition of circuitry onto a thermoplastic material. In one of its aspects, the invention relates to vacuum deposition of circuitry for automotive applications. In another of its aspects, the invention relates to a vehicular lamp housing incorporating a circuit placed thereon by vacuum deposition. In another of its aspects, the invention relates to a vehicular lamp housing with vacuum deposition of circuitry powering light-emitting diodes. In another of its aspects, the invention relates to a vehicular lamp housing with a vacuum deposition of circuitry powering removable incandescent lamps.

2. Description of the Related Art

It is known to create circuit boards using vacuum deposition on a microscopic scale. In this method, microscopic vacuum deposition is accomplished by use of a focused electron beam to create circuitry tracks on the circuit board. Each track is developed on the circuit board to a thickness of only a few angstroms to provide a circuit capable of carrying the very small currents required by the circuit board.

A larger-scale vacuum deposition process is known in creating reflectorized surfaces such as for the interior of a lamp housing to provide a reflective backdrop for an incandescent lamp for projecting light through a lens covering the lamp housing for observation by other motorists. Such large-scale vacuum deposition is accomplished in a vacuum deposition chamber. Lamp housings to be deposited with the reflective coating are physically masked and passed in front of a chromium target subjected to a high voltage, which causes chromium particles to leave the target and embed in the plastic material of the lamp housing. This process creates a coating of chromium on the plastic housing 200 to 400 angstroms thick on unmasked portions of the lamp housing. The reflectorized lamp housing is then provided with a covering translucent lens and electrical circuits and bulbs as is known in the prior art. Such prior art lamp housings come in many forms.

Referring to one example of a prior art lamp housing assembly shown in FIG. 1, a housing 10 has an inner surface 12, usually coated with a reflective material, and a number of apertures 14 for insertion of lamps 16 from a rear portion of housing 10. The front portion of housing 10 is covered by a translucent lens 18, lens 18 commonly having regions of different colors based on the function of the lamp 16 projecting light through that portion of the lens 18. The individual lamps 16 are provided power through a wire harness 17 connected to each of the lamps 16.

FIGS. 2 and 3 show further prior art embodiments wherein bulbs 16 are each carried by a removable socket 22, and insertion of the socket 22 into the apertures of the housing electrically connects the bulbs 16, in the case of FIG. 2, to a flexible printed circuit 24, or in the case of FIG. 3, to a stamped metal harness 26, the printed circuit 24 or stamped metal harness 26 themselves being electrically connected to the automobile's electrical system to complete a current-carrying circuit. Each of the prior art embodiments of FIGS. 2 and 3 further requires additional interface pieces 28, 30, 32 for attaching and mating the bulbs to the housing 10.

Referring now to FIG. 4, a further embodiment of a prior art lamp housing 40 is adapted to receive a number of light-emitting diodes (LED) 42 held in a snap LED holder 44 constructed with offsets 46 for matching the contour of the housing 40. The front of the housing 40 is covered by a lens 48.

Yet another prior art embodiment is shown in FIG. 5 wherein a housing 50 carries a printed circuit board 52 with a number of LEDs 54 mounted thereon, a reflector 56 covering the printed circuit board 52 with LEDs 54 projecting therethrough, and a lens 58 mounted to the front of the housing 50 to seal the housing 50, holding the printed circuit board 52 and reflector 56 therein.

Each of these prior art lamp housings has inherent disadvantages. The wire harness type lamp housing (FIG. 1) has a high piece price, mechanical size constraints, and is labor intensive to build and install. The flex circuit (FIG. 2) can be costly, and sealing the flex circuit to the housing, as well as the mechanical integrity of the electrical connector to the housing are limiting factors. Servicing, capital equipment costs and installation costs of the assembly are further disadvantages. The metal circuit stamping housing (FIG. 3) has the disadvantages of high tooling costs, handling costs, sealing and installation costs. The flat LED metal frame (FIG. 4) has a high piece price, planar design limitations, limited suppliers, and is limited to LED designs. The LED printed circuit board assembly (FIG. 5) has a high piece price, is limited to a planar design, has high installation costs, and, again, is only for use with LEDs.

It would be advantageous to provide a lamp housing to overcome the disadvantages of the prior art, in that it would be adaptable to use with LEDs as well as conventional incandescent or other available lamp technologies, is adapted for providing different colors of light, specifically white light, and is efficient in both space requirements and installation costs.

SUMMARY OF THE INVENTION

The invention relates to a method for vacuum deposition of circuitry onto a thermoplastic material. In one of its aspects, the invention relates to vacuum deposition of circuitry for automotive applications. In another of its aspects, the invention relates to a vehicular lamp housing incorporating a circuit placed thereon by vacuum deposition. In another of its aspects, the invention relates to a vehicular lamp housing with vacuum deposition of circuitry powering light-emitting diodes. In another of its aspects, the invention relates to a vehicular lamp housing with a vacuum deposition of circuitry powering removable incandescent lamps.

In one specific application of the method of vacuum depositing circuitry according to the invention, the invention can be applied to an automotive lamp housing wherein the lamps are electrically connected to the vehicle electrical system by an electrical circuit embedded on the surface of the lamp housing by direct metallization of the circuitry onto the lamp housing, such as by vacuum deposition. In one of its aspects, the invention contemplates metallization of the circuitry to the interior of the housing for direct connection of a plurality of light-emitting diodes for buttressing light from the lamp housing. In another of its aspects, the housing includes openings for removably receiving incandescent or other conventional lamps electrically connected to the electrical circuit embedded in the housing. In another of its aspects, the electrical circuit embedded in the housing is electrically connected to the automotive electrical system at a single location.

BRIEF DESCRIPTION OF THE DRAWINGS

In the drawings:

FIG. 6A is an enlarged view of an LED being placed against the circuitry of FIG. 6;

DESCRIPTION OF THE PREFERRED EMBODIMENT

The inventive process described herein starts with a plastic substrate. One such example is an injection-molded plastic housing, the plastic housing provided with convenient track areas to deposit the circuitry, wherein the housing is further modified to eliminate sharp corners to allow for complete, continuous, uniform deposition of the circuit trace over the topography of the housing. The housing is placed in a mask. The mask covers most of the housing, leaving only the exposed areas that will be embedded or coated with a copper or other metallic deposit during the vacuum deposition process. The masked part is then placed in a vacuum deposition chamber. The chamber is activated, a vacuum is drawn in the chamber, and the deposition process begins. A "target" in the chamber is subjected to an electrical charge, forcing a release of metallic particles into the vacuum. The metallic particles bombard the exposed areas of the plastic substrate and are embedded into the plastic surface. The metallic particles build a layer of metallic material on the plastic part until the desired trace thickness is reached. It was found that the metallic material, such as copper, deposited on the plastic part reaches the desirable conductivity when the thickness of the trace reaches 1 to 4 microns (or 1,000 to 4,000 angstroms). This increased thickness of the vacuum deposition increases the conductivity of the deposited circuit tracks so that the deposited circuit track can handle the current requirement for the intended application. The part can then be removed from the vacuum chamber and further processed for its end use.

Figure 1:
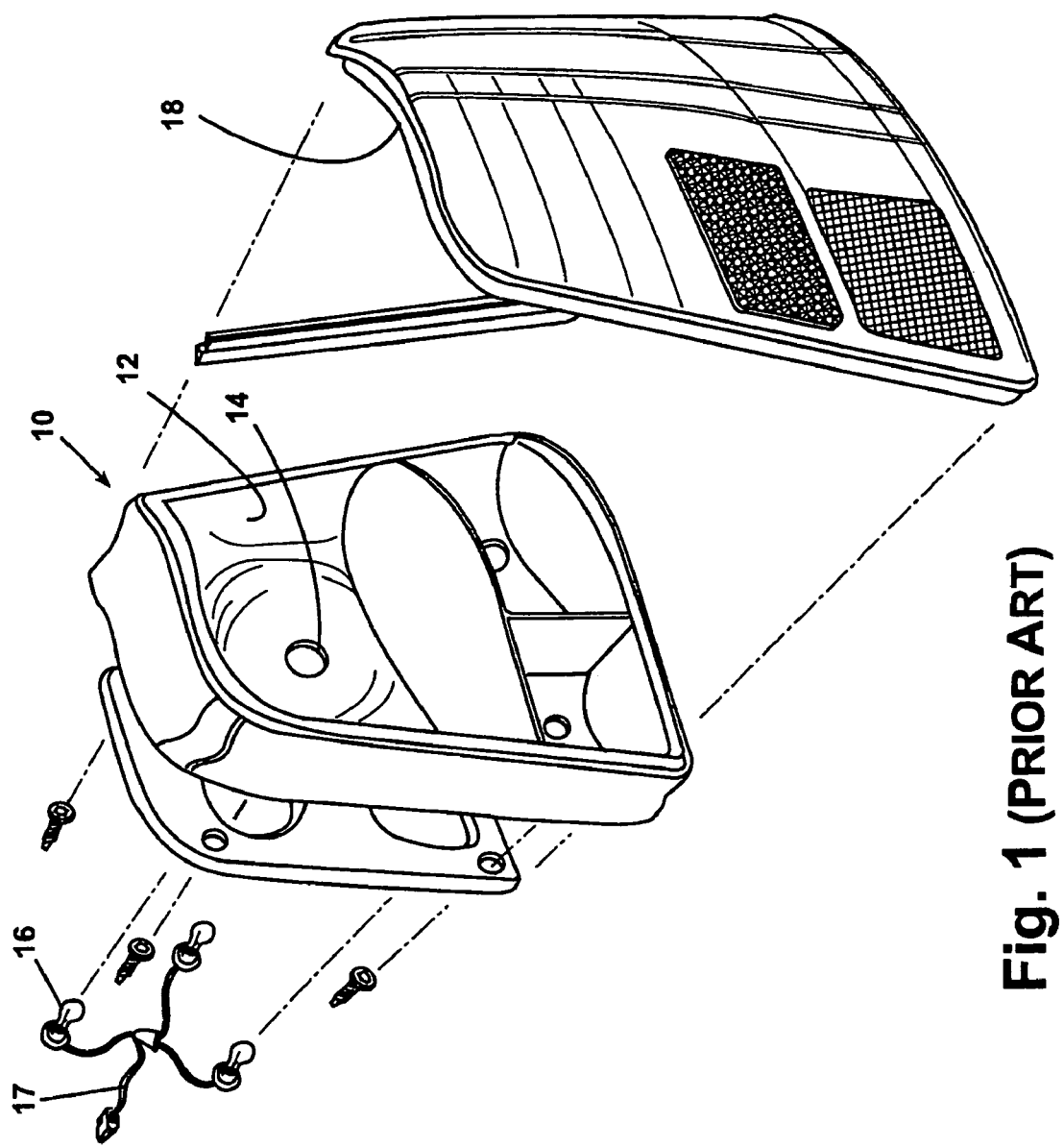
FIG. 1 is a prior art lamp assembly comprising a housing, a lens, and various light sources provided with a wire harness interconnecting the various light sources to an electrical system of a vehicle.
Figure 2:
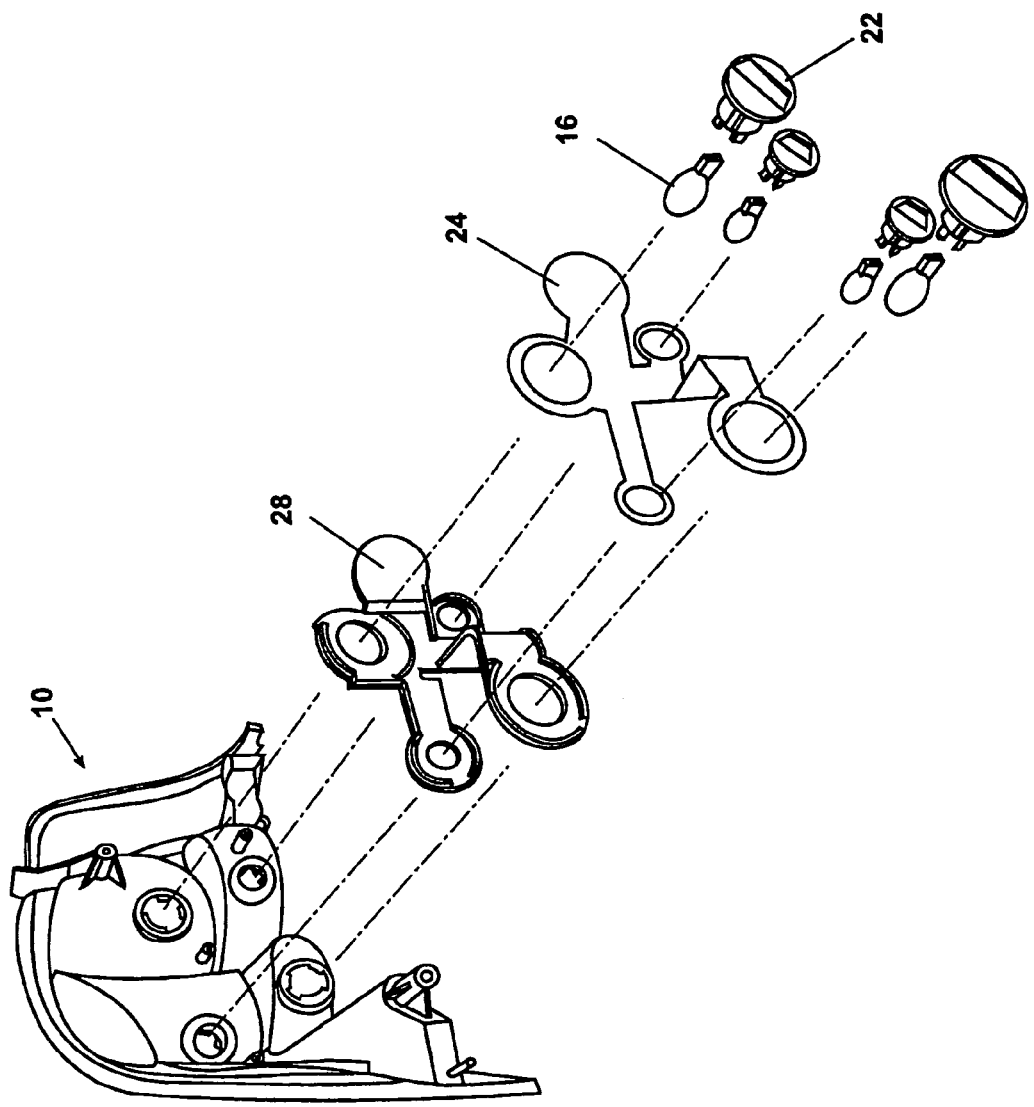
FIG. 2 is a prior art lamp assembly comprising a housing, a lens, and various light sources provided with a flex circuit interconnecting the various light sources to an electrical system of a vehicle.
Figure 3:
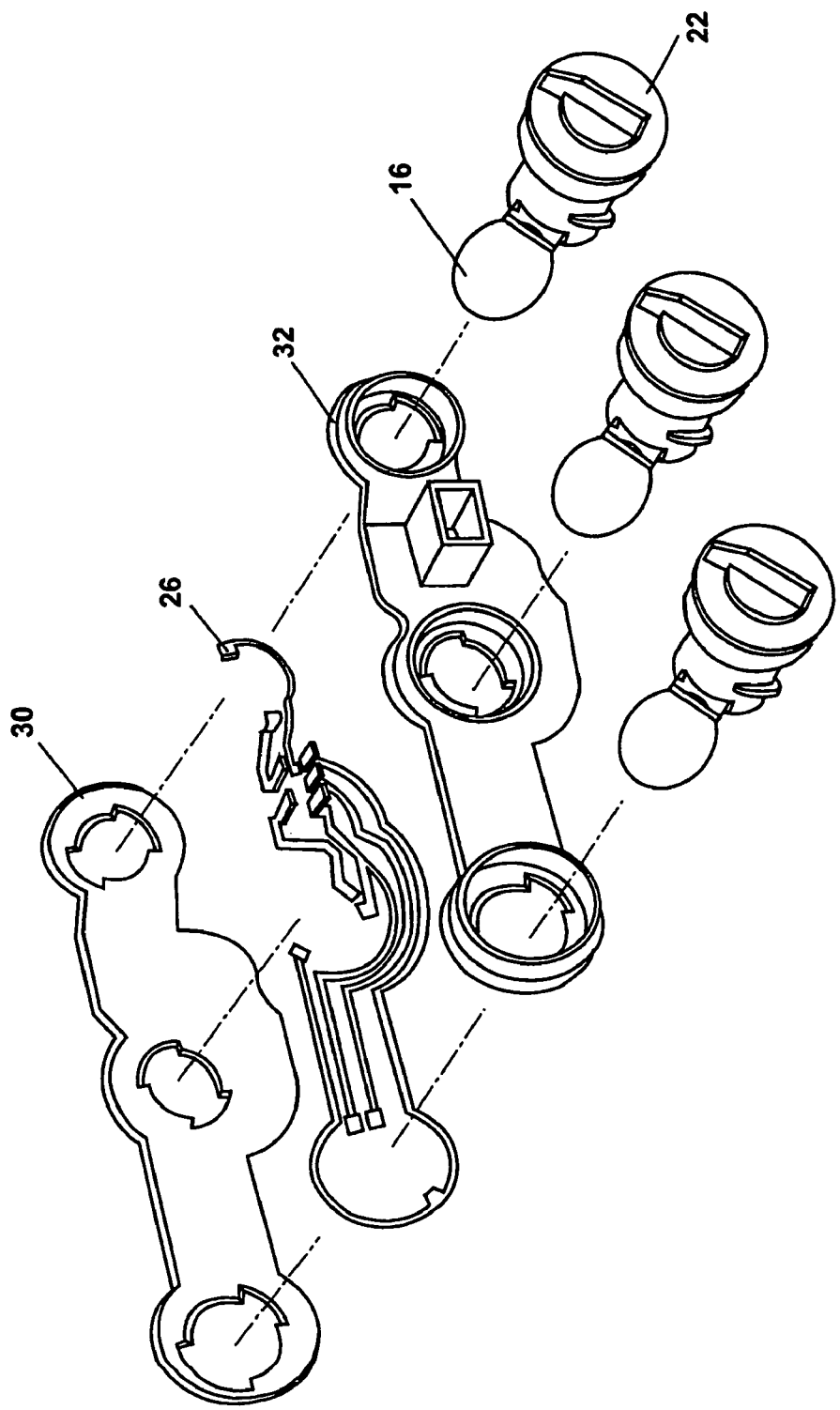
FIG. 3 is a prior art lamp assembly comprising a housing, a lens, and various light sources provided with a metal circuit stamping interconnecting the various light sources to an electrical system of a vehicle.
Figure 4:
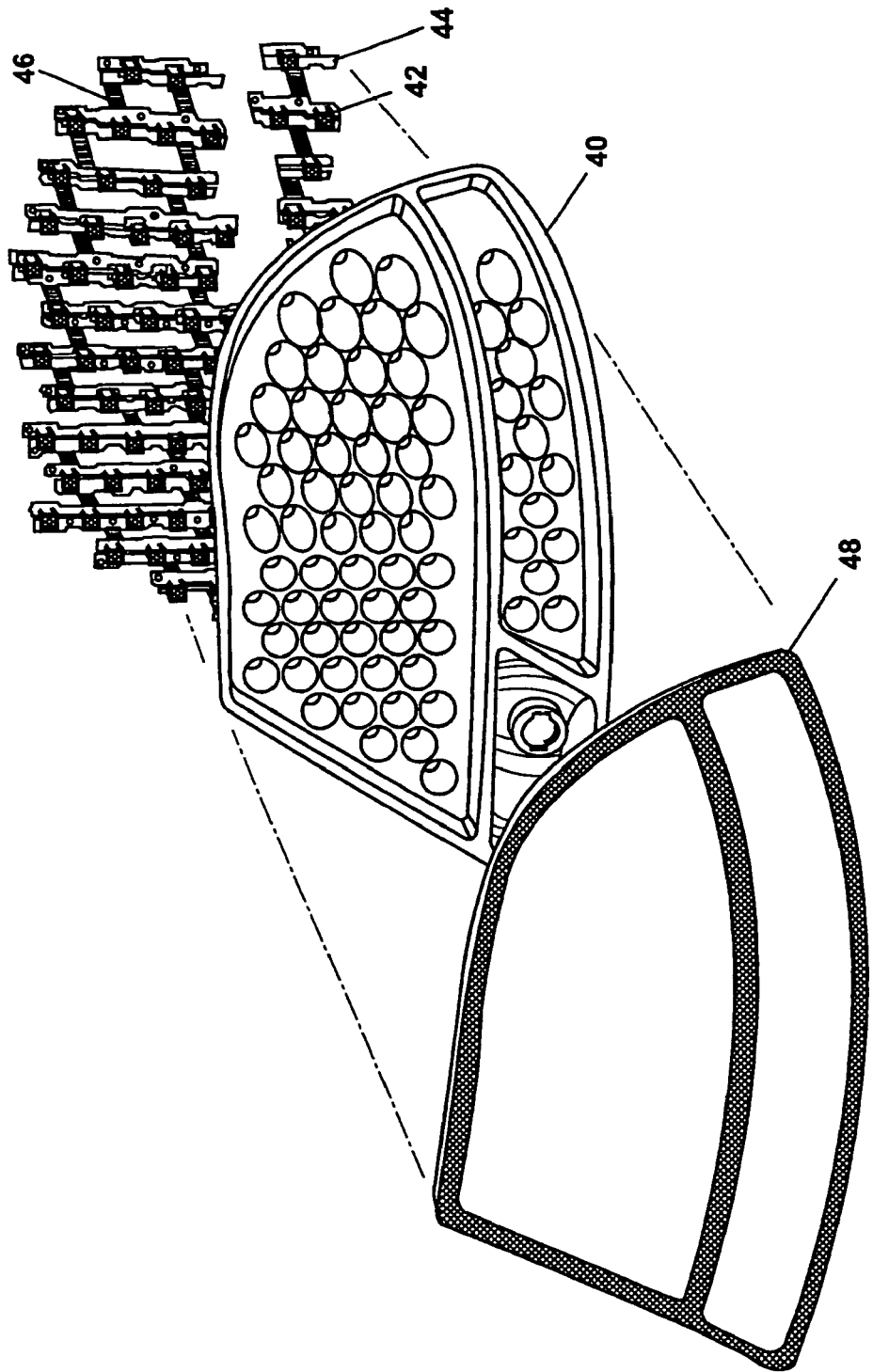
FIG. 4 is a prior art lamp assembly comprising a housing, a lens, and various light sources provided with snap LEDs metal-framed assemblies interconnecting the various light sources to an electrical system of a vehicle.
Figure 5:
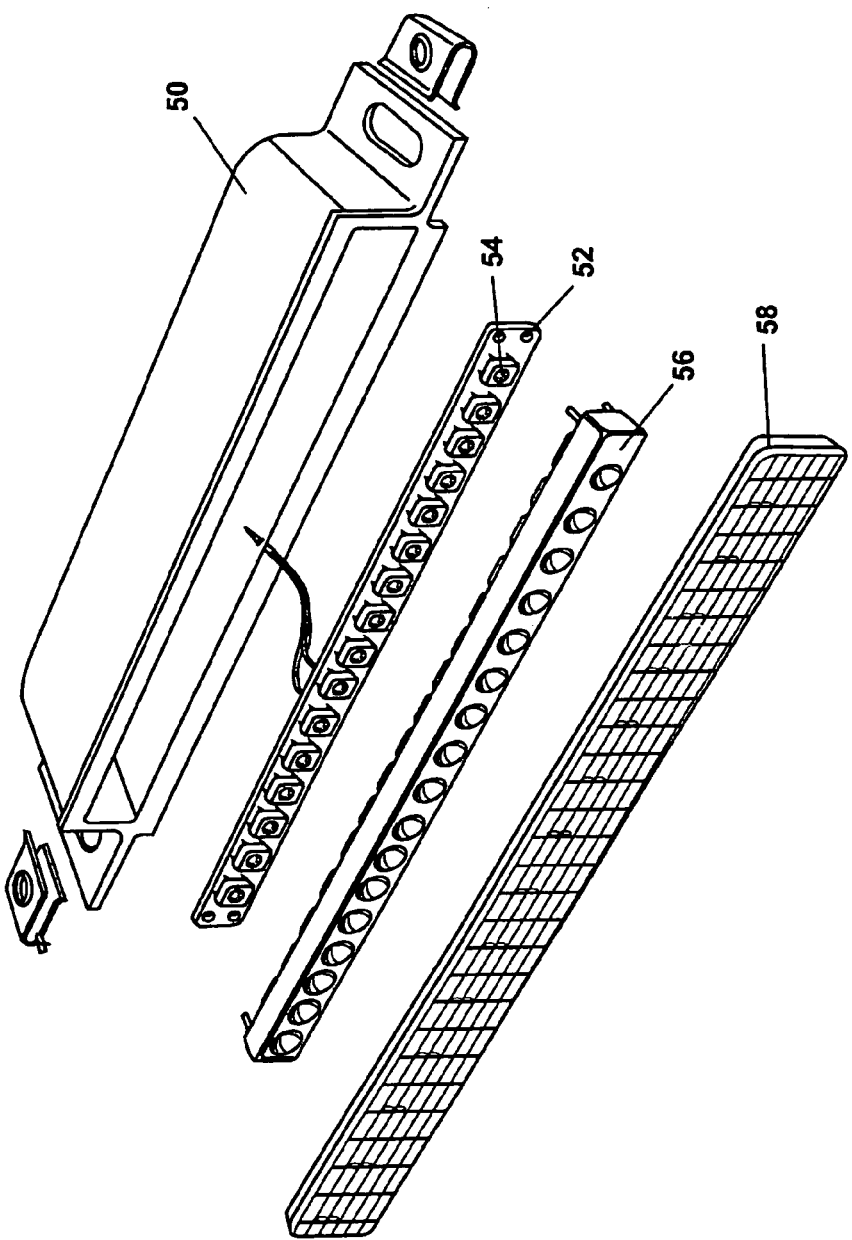
FIG. 5 is a prior art lamp assembly comprising a housing, a lens, and various light sources provided with LED printed circuit board assemblies interconnecting the various light sources to an electrical system of a vehicle.
Figure 6:
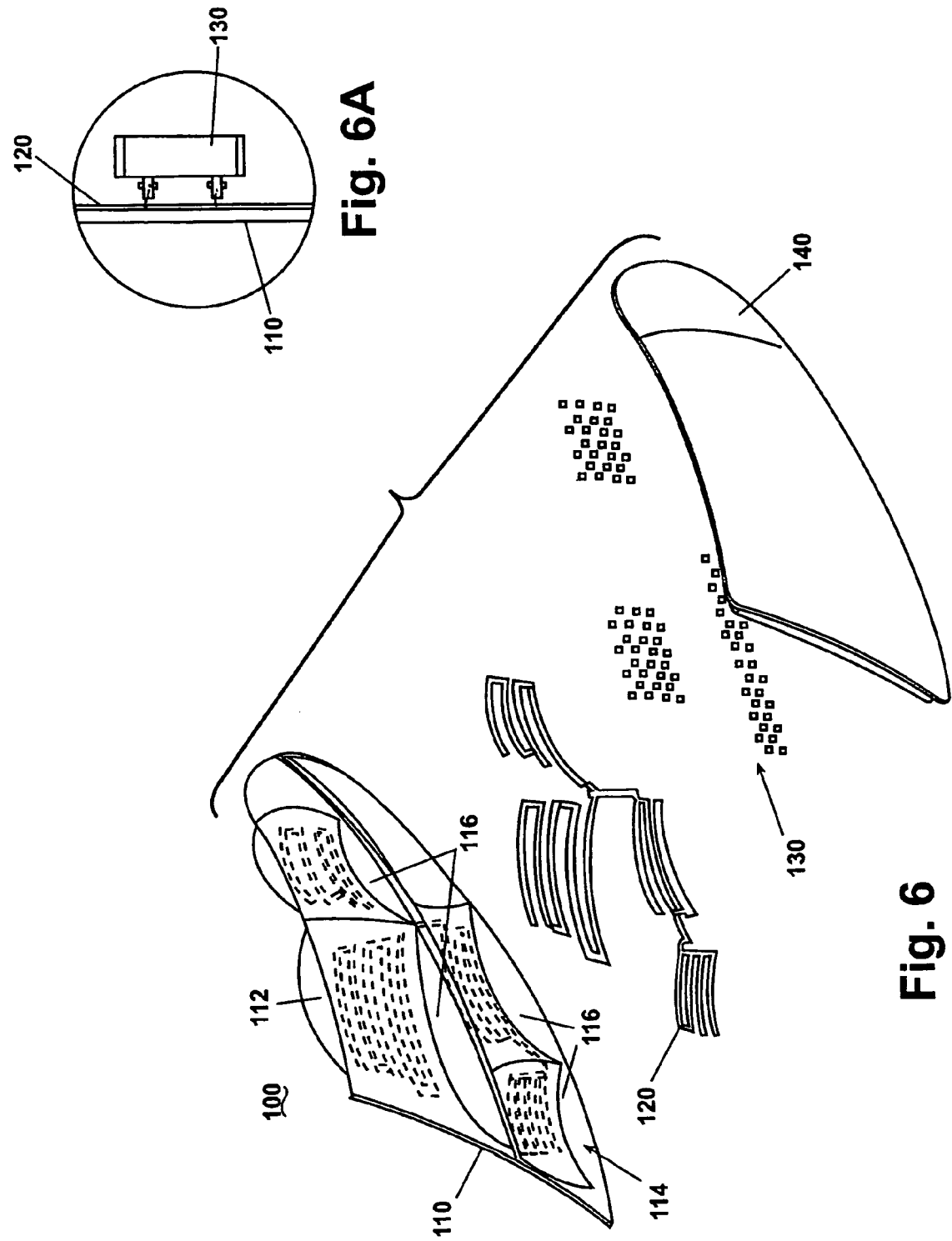
FIG. 6 is an exploded perspective view of a direct metallization of circuitry onto a plastic automotive lamp housing according to the invention.

An example of an embodiment of the invention is shown in FIG. 6 in a lamp assembly 100 with direct metallization of lamp circuitry (a "spray circuit" 120) onto a lamp housing 110. The assembly 100 further comprises a plurality of light-emitting diodes (LEDs) 130 and a lens 140.

The lamp housing 110 has an outer, or back, surface 112 and an inner surface 114. The housing 110 is divided into a number of compartments 116, wherein the inner surface 114 of each compartment 116 is generally concave in nature.

Spray circuit 120 is applied to inner surface 114 of housing 110 by one of various known methods of vacuum deposition, as such as sputter, cathodic arc, and E-beam technologies. Other variations or modifications of these methodologies, as are known in the art, will function for the purpose of depositing the spray circuit 120 on the housing 110, but the method chosen must accomplish the result while optimizing the overall manufacturing process, particularly with regard to cycle times involved in the chain of manufacture, such as the molding time necessary for the housing 110. The spray circuit 120 is applied to the inner surface 114 of housing 110, placing the spray circuit 120 within the compartments 116 of the housing 110. LEDs 130 are then placed into the circuit 120 within the compartments 116 of the housing 110 using a conventional pick-and-place robot system. The LEDs 130 are placed directly to the surface contour of the inner surface 114 of the housing 110 (see FIG. 6A). The LEDs 130 are then soldered in place using known methods such as convection reflow, infrared reflow, silver epoxy, or standard wave solder for planar through-hole designs. In a preferred process, the LEDs 130 are held in place prior to soldering by using an adhesive dispensing capability of the pick-and-place robot system. The spray circuit 120 is electrically connected to the vehicle's electrical system through the back surface 112 of housing 110 by a single conventional wire connector (not shown).

After placement of the LEDs 130 into the spray circuit 120 on the inner surface 114 of housing 110, lens 140 is then sealed to lamp housing 110, enclosing compartments 116 and preventing the infiltration of dirt or moisture into the compartments 116 of housing 110.

The assembly 100 thus presents a unitary, sealed assembly for installation in a vehicle using simple mechanical connectors for physical attachment to the vehicle, and a single space- and labor-efficient electrical connector to the vehicle's electrical system.

Figure 7:
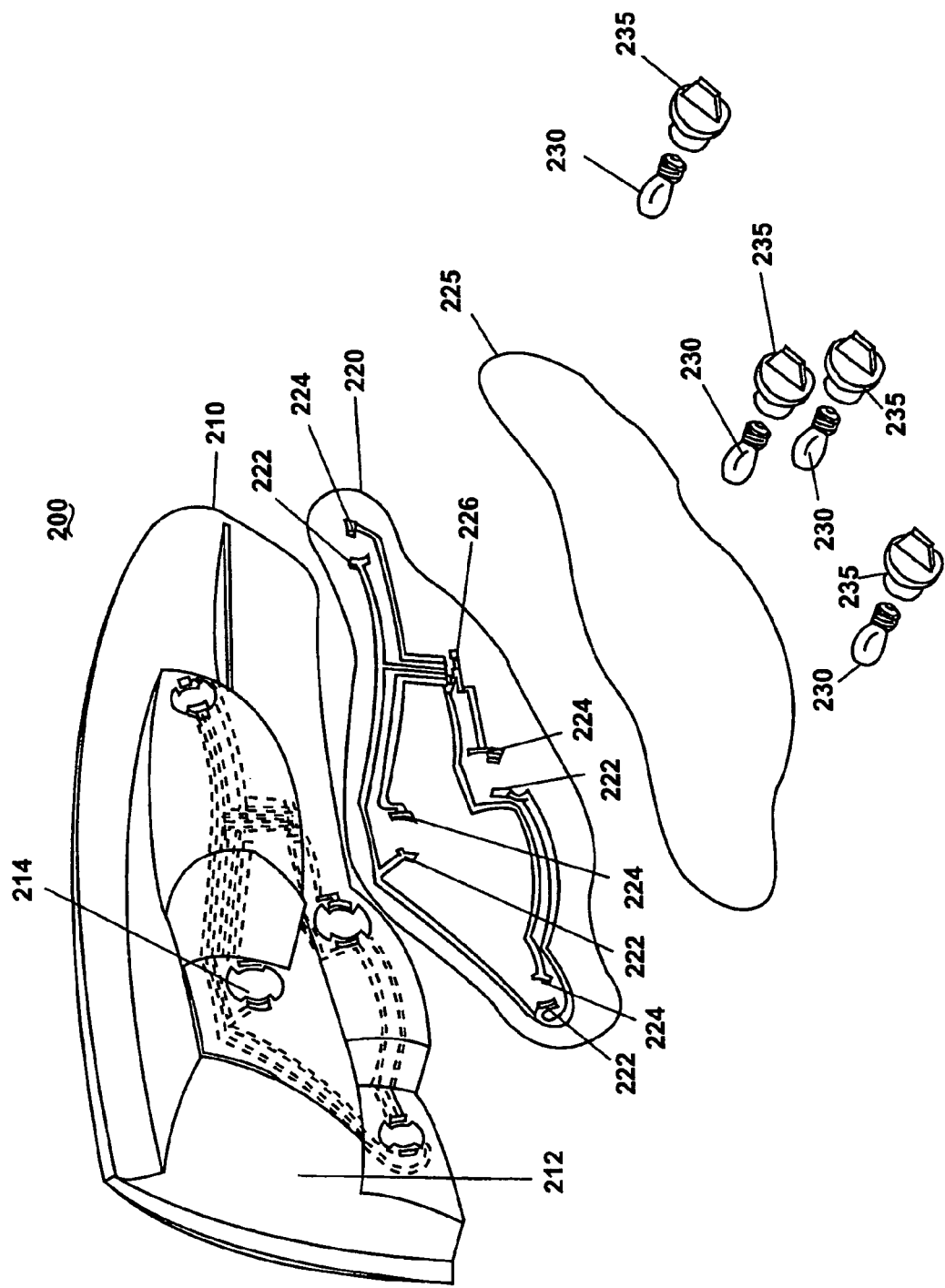
FIG. 7 is a further embodiment of direct metallization of circuitry onto a plastic automotive lamp housing according to the invention.

A further embodiment of a lamp assembly 200 according to the invention is disclosed in FIG. 7. Assembly 200 comprises a housing 210, a spray circuit 220, a spray seal 225, and a plurality of bulbs 230 and sockets 235.

Housing 210 comprises a back surface 212 and an inner surface (not shown) having a reflective coating thereon, divided into compartments, and sealed by a lens (not shown). Housing 210 further comprises a number of keyed openings 214 opening into the compartments of the housing 210. The housing is prepared for deposition of the spray circuit 220 onto the back surface 212 of the housing 210 in the same manner as described in the first embodiment of the invention, namely, a mask is applied to the back surface 212 of the housing 210 and the housing is placed in a vacuum deposition chamber wherein metallic particles are embedded in the exposed back surface 212 of the housing 210 where the mask does not cover the housing 210.

Spray circuit 220 is configured to provide a pair of terminals 222, 224 at each keyed opening 214 of the housing 210, whereby each of the terminals 222, 224 will connect with bulb 230 to complete a circuit for providing electrical energy to the bulb 230. After deposition of the spray circuit 220 on the back surface 212 of housing 210, a spray seal 225, using conventional printed circuit board coating methods, is applied to the back surface 212 for electrically insulating and protecting the spray circuit 220. It is also anticipated to apply a protective coating to the circuit as a further step of the vacuum metallization process, while the lamp housing 210 is still in the vacuum metallization chamber. The terminals 222, 224 will necessarily be exposed to enable electrical connection of the bulbs 230 therewith. Spray circuit 220 further includes a single terminus 226 for electrically connecting the spray circuit to the vehicle electrical system through the use of a single conventional electrical connector and wiring (not shown).

The lamp assembly 200 now presents a unitary assembly for installation in a vehicle and connection to the vehicle electrical system through a single connector and wire via the terminus 226. Prior to or after installation of the lamp assembly 200 in a vehicle, lamps 230 and sockets 235 can be adjoined to housing 210. Sockets 235 are configured to removably carry lamps 230, holding lamps 230 physically and providing an electrical connection between lamps 230 and spray circuit 220, as is commonly known in the art. Sockets 235 are further configured to engage keyed openings 214 of housing 210, whereby upon insertion of socket 235 in opening 214 and rotation of socket 235, socket 235 is mechanically engaged within opening 214 for retaining bulb 230 within housing 210. Simultaneously, upon rotating socket 235 in keyed opening 214, an electrical connection is made between socket 235 and terminals 222, 224, as is well known in the art. Bulb 230 is also therefore electrically connected to terminal 222, 224 completing the electrical circuit including bulb 230.

Assembly 200 therefore provides the advantage of being a single unit that can be installed in a vehicle using common mechanical fasteners and can be electrically connected to a vehicle electrical system by a single common electrical connector and wiring, making for simplified, labor-saving installation. Replacement of bulbs 230 as they burn out is accomplished by removing the damaged lamp 230 from housing 210 by rotating socket 235 within keyed opening 214, removing socket 235 and lamp 230 from housing 210, removing and replacing lamp 230, then reinstalling in housing 210.

FIGS. 8-11 depict steps of the method incorporated in the invention, the further embodiment of a lamp assembly 300, including a lamp housing 310 forming by injection-molding processes known in the art.

Figure 8:
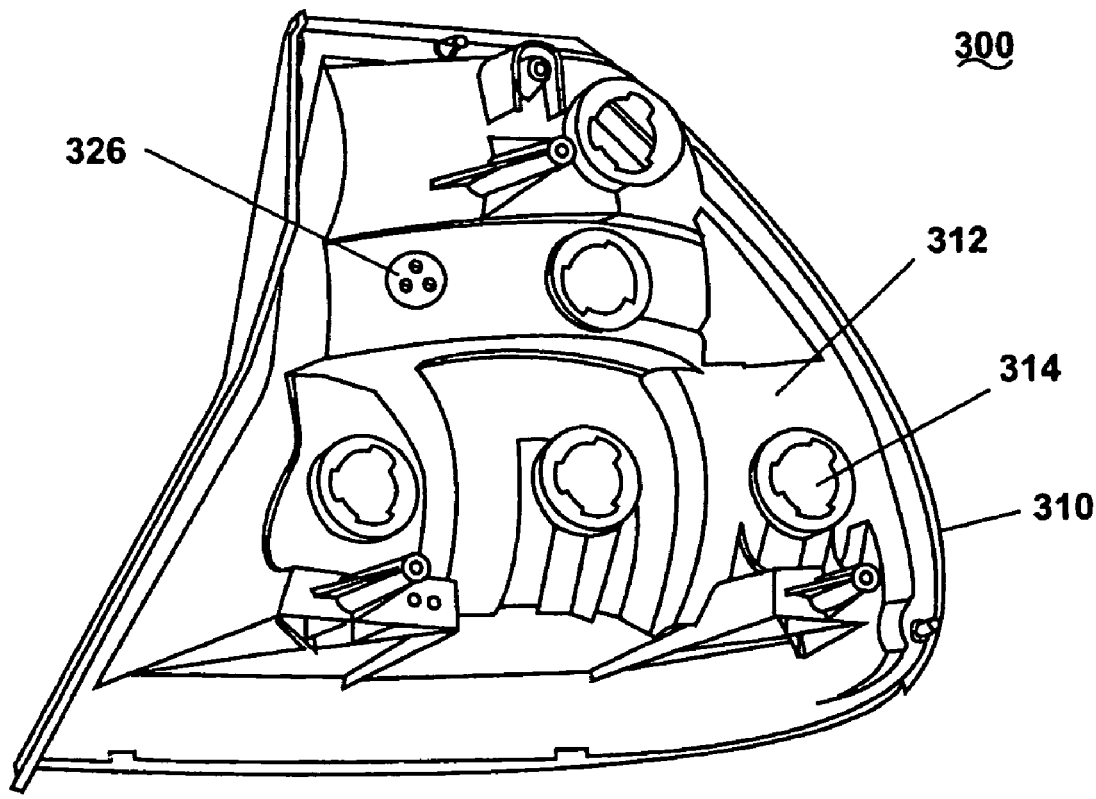
FIG. 8 is a rear perspective view of a lamp housing having a complicated topography prior to application of a circuit directly thereto.

As shown in FIG. 8, the lamp housing 310 includes a back surface 312, a number of keyed openings 314 passing through the housing 310, and a terminus 326 for the spray circuit to be applied for electrical connection to the vehicle's electrical system.

Figure 9:
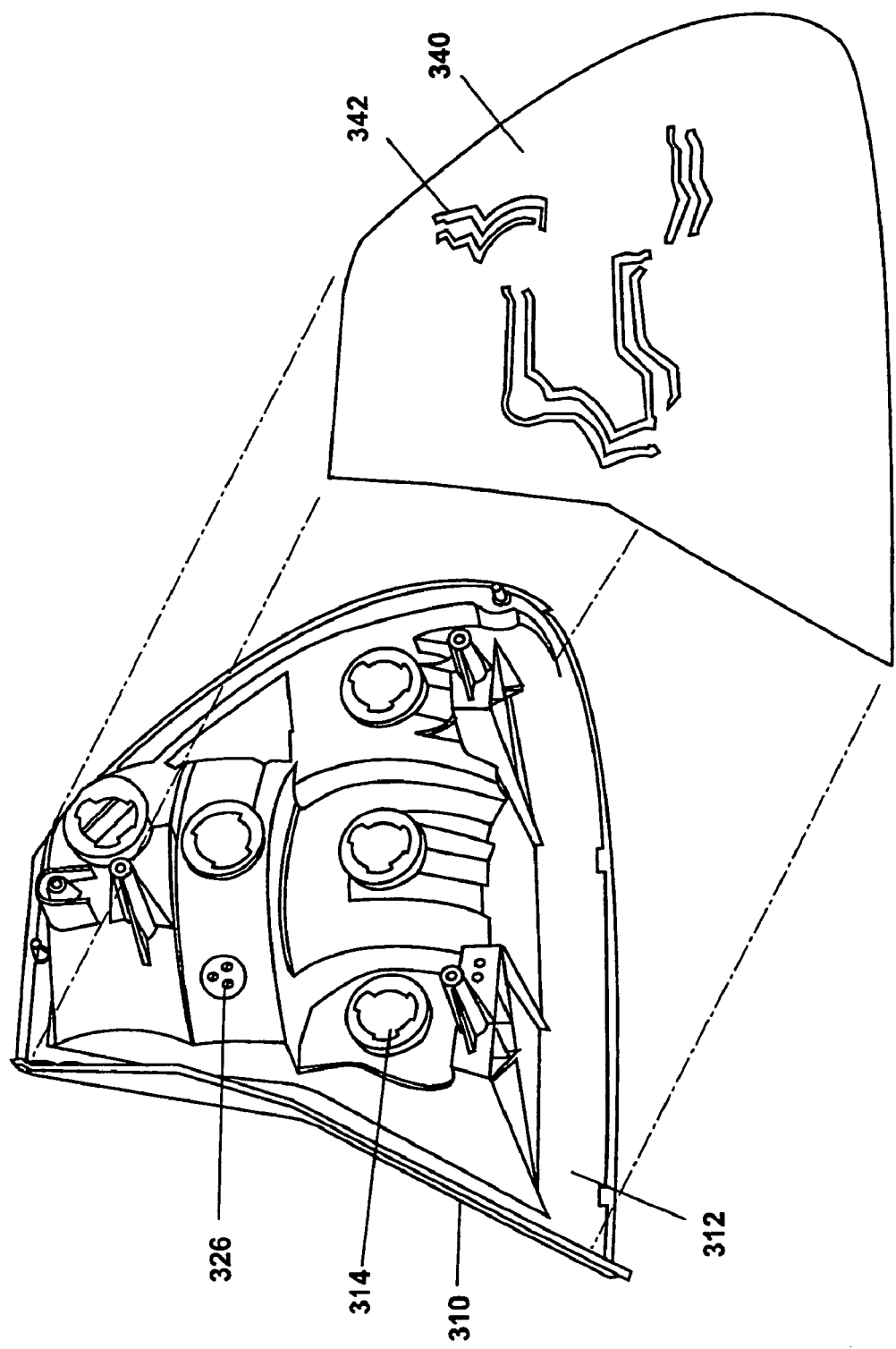
FIG. 9 depicts application of a mask to the lamp housing of FIG. 8 according to the invention.

Referring to FIG. 9, a mask 340 is secured to the back surface 312 of the lamp housing 310. Mask 340 includes a precise pattern of openings 342 coordinated with the back surface 312 of the lamp housing and, more particularly, the keyed openings 314 and the terminus 326 of the lamp housing 310. When the mask 340 is applied to the back surface 312 of the lamp housing 310, the mask 340 covers the entirety of back surface 312 except for those portions of back surface 312 that are exposed through openings 342.

Figure 10:
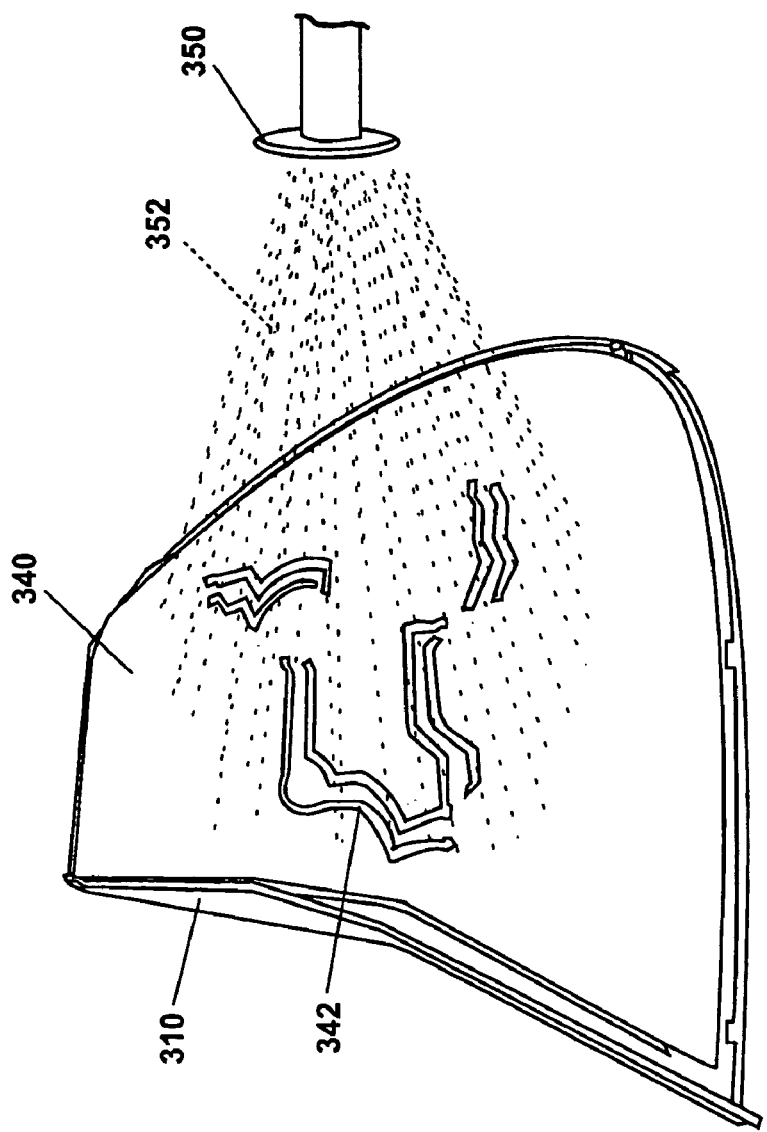
FIG. 10 depicts metallization of the lamp housing of FIGS. 8-9 with mask applied.

Referring now to FIG. 10, the lamp housing 312 with applied mask 340 is then placed in a vacuum metallization chamber. A vacuum is applied to the chamber and a metallizing or sputtering target 350 is energized causing metallic particles 352 to be expelled from the surface of the target 350. As the metallic particles 352 strike the masked lamp housing 310, they are deposited on the exposed portions of the lamp housing 310 through the openings 342 of the mask 340. This metallization process is carried out until a sufficient layer of the metallic particles 352 is deposited on the lamp housing 310 to form an electrical circuit having the capacity for the expected current load.

Figure 11:
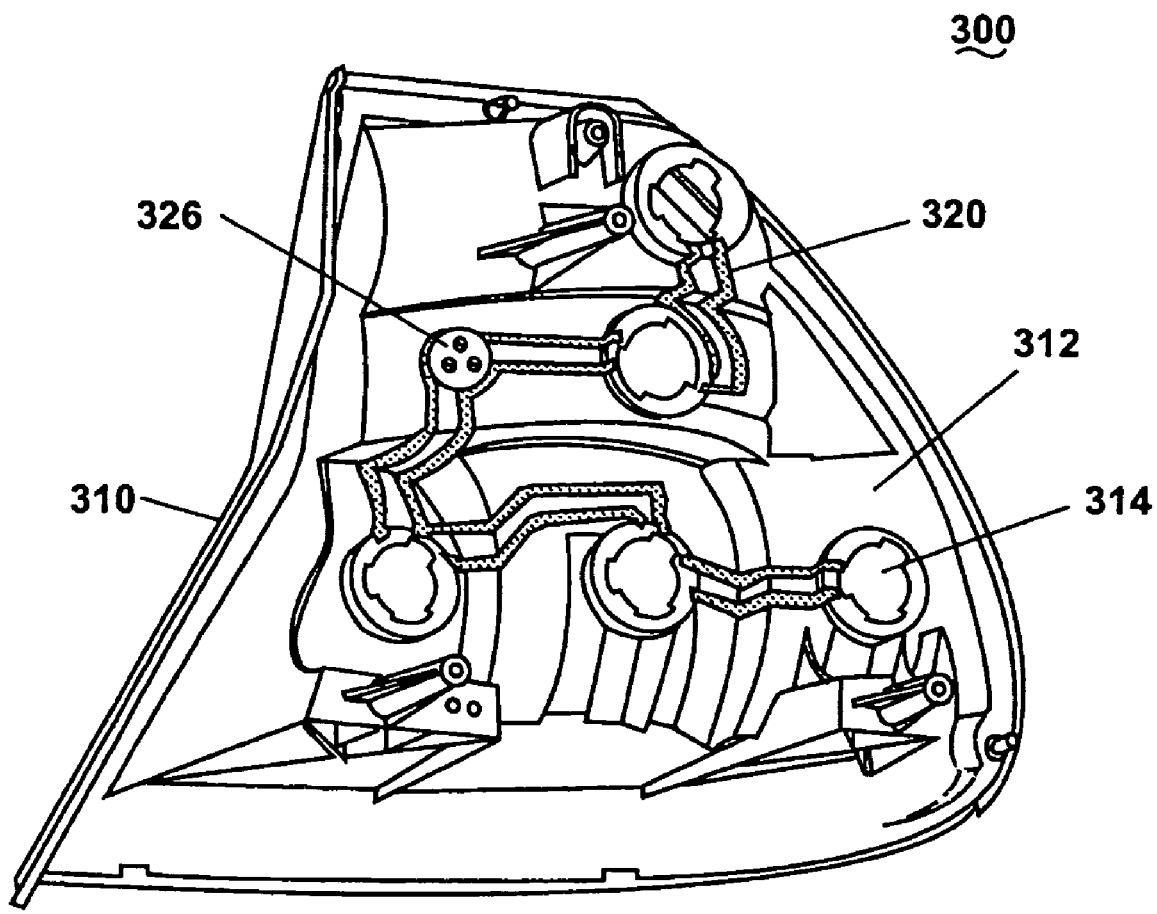
FIG. 11 depicts the lamp housing of FIGS. 8-10 with the circuitry applied and mask removed.

Upon removal from the vacuum metallization chamber, referring to FIG. 11, the mask 340 is removed, exposing the back surface 312 of the lamp housing 310. The metallic particles 352 of the vacuum metallization process can be seen in FIG. 11 to form circuit traces 320 on the back surface 312 of the lamp housing 310, the circuit traces 320 connecting each of the keyed openings 314 of the lamp housing 310 with the terminus 326 for electrical connection to the vehicle's electrical system. Subsequent to the application of the circuit traces 320 on the lamp housing 310, a spray seal, as discussed in the previous embodiment, is applied to the lamp housing 310 to protect the circuit traces 320.

A like process for the embodiment of FIG. 6 can be utilized on the front face thereof.

The direct metallization of circuitry on a plastic substrate, according to the invention, provides the advantage of more economical construction, assembly and installation, and, with respect to one example application in the area of vehicular lamp housings, further provide a more compact installation due to the elimination of need for external assemblies mounted to a housing that would increase the space needed for the housing in the vehicle. These circuits and assemblies are instead molded directly into the housing, conforming to the contour of the housing, minimizing space requirements, and eliminating the need for additional assemblies to the housing. The material for the housing must necessarily be chosen such that its temperature characteristics are compatible with the temperature characteristics of the electrical components mounted to it. Such compatibility will avoid any melting of the plastic housing due to electrical component heat dissipation. The spray circuits 120, 220, 320 must also necessarily be configured to handle the current requirements of the electrical components.

Ideally, the cycle time of the vacuum deposition chamber will be compatible with the cycle time of other equipment in the fabrication chain, such as the molding machine, thereby adding no additional cycle time to the assembly cost. It is anticipated that a single operator can unload the molding machine, such as an injection press, and load the vacuum chamber with the masked housing. It is also anticipated that the vacuum chamber will simultaneously place the reflective coating and the spray circuitry on the housing.

While the invention has been specifically described in connection with certain specific embodiments thereof, it is to be understood that this is by way of illustration and not of limitation, and the scope of the appended claims should be construed as broadly as the prior art will permit.

We claim:

1. A method of manufacturing a conductive lamp housing, comprising depositing particles by direct metallization to form a layer of conductive material of 1 to 4 microns thick on a generally non-planar surface of a substrate that forms part of the lamp housing, in order to form part of one or more electrical spray circuits when said conductive material is connected to at least one or more power sources and one or more light sources.

2. The method of manufacturing a lamp housing of claim 1, wherein the direct metallization deposition of the layer of conductive material is deposited by vacuum deposition in a vacuum chamber.

3. The method of manufacturing a lamp housing of claim 2, wherein the layer of conductive material is deposited by sputter vacuum deposition.

4. The method of manufacturing a lamp housing of claim 2, wherein the layer of conductive material is deposited by cathodic arc vacuum deposition.

5. The method of manufacturing a lamp housing of claim 2, wherein the layer of conductive material is deposited by E-beam vacuum deposition.

6. The method of manufacturing a lamp housing of claim 1, wherein the layer of conductive material is metal.

7. The method of manufacturing a lamp housing of claim 1, further comprising a step of forming distinct electrical pathways in the layer of conductive material during deposition.

8. The method of manufacturing a lamp housing of claim 7, wherein the distinct electrical pathways are formed by masking the lamp housing prior to deposition of the layer of conductive material on the lamp housing.

9. The method of manufacturing a lamp housing of claim 1, further comprising a step of depositing a reflective coating on the substrate.

10. The method of manufacturing a lamp housing of claim 9, wherein the conductive material and reflective coating are formed on the substrate within the same vacuum chamber.

11. The method of manufacturing a lamp housing of claim 9 wherein the conductive material and reflective coating are formed on the substrate simultaneously in the same vacuum chamber.

12. The method of manufacturing a lamp housing of claim 1, further comprising a step of applying a spray seal on said substrate.

13. The method of manufacturing a lamp housing of claim 1, further comprising a step of applying a protective coating to said conductive material.

14. The method of manufacturing a lamp housing of claim 1, wherein the step of depositing a conductive layer further comprises depositing one or more terminals for contacting said light sources.

15. The method of manufacturing a lamp housing of claim 1, wherein the step of depositing a conductive further layer comprises depositing at least one connection for electrically connecting said conductive layer to said power sources.

16. The lamp housing of claim 1 wherein the lamp housing is comprised of a thermoplastic material.

17. The lamp housing of claim 1 wherein the generally non-planar surface is comprised of a plurality of compartments, each compartment being generally concave.

18. A lamp housing comprising a generally non-planar substrate, further comprising a conductive layer for one or more electrical circuits deposited directly on said substrate, wherein said conductive layer is 1 to 4 microns thick, wherein said electrical circuits are connected to at least one or more power sources and one or more light sources.

19. The lamp housing of claim 18, wherein the conductive layer is formed by vacuum deposition of the electrical circuits on said substrate.

20. The lamp housing of claim 19, wherein the conductive layer is directly embedded in said substrate.

21. The lamp housing of claim 19, further comprising one or more terminals attached to the conductive layer at said openings.

22. The lamp housing of claim 19, wherein said light sources comprise one or more light emitting diodes.

23. The lamp housing of claim 19, wherein said light sources comprise one or more incandescent lamps.

24. The lamp housing of claim 18, further comprising one or more openings in said lamp housing for one or more light sources.

25. The lamp housing of claim 18, further comprising a reflective coating.

26. The lamp housing of claim 18, further comprising a spray seal.

27. The lamp housing of claim 18, further comprising a protective coating on said conductive layer.

28. The lamp housing of claim 18, further comprising a single connection for electrically connecting said circuits to one or more power sources.

29. The lamp housing of claim 18, wherein said housing comprises one or more molded channels to facilitate receipt of said conductive layer.

30. The lamp housing of claim 18, wherein said housing comprises one or more smooth corners to facilitate receipt of said conductive layer.

* * * * *